United States Patent
Benenati et al.

(10) Patent No.: US 6,258,627 B1
(45) Date of Patent: Jul. 10, 2001

(54) UNDERFILL PREFORM INTERPOSER FOR JOINING CHIP TO SUBSTRATE

(75) Inventors: Joseph A. Benenati, Hopewell Junction, NY (US); William T. Chen, Singapore (SG); Lisa A. Fanti, Hopewell Junction, NY (US); Wayne J. Howell, Williston, VT (US); John U. Knickerbocker, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/233,388

(22) Filed: Jan. 19, 1999

(51) Int. Cl.[7] .............................. H01L 21/44; H01L 21/60
(52) U.S. Cl. ........................ 438/108; 438/106; 438/118
(58) Field of Search ................................ 438/108, 109, 438/111, 118, 119, 125, 128, 129, 624

(56) References Cited

U.S. PATENT DOCUMENTS

| | | | |
|---|---|---|---|
| 3,719,981 | * 3/1973 | Steiz | 29/423 |
| 4,967,313 | * 10/1990 | Berner | 361/400 |
| 5,019,673 | * 5/1991 | Juskey | 174/52.2 |
| 5,111,279 | * 5/1992 | Pasch | 357/81 |
| 5,258,648 | * 11/1993 | Lin | 257/778 |
| 5,261,155 | * 11/1993 | Angulus | 29/830 |
| 5,367,765 | * 11/1994 | Kusaka | 29/840 |
| 5,468,681 | * 11/1995 | pasch | 437/183 |
| 5,493,075 | * 2/1996 | Chong | 174/261 |
| 5,509,203 | * 4/1996 | Yamashita | 29/879 |
| 5,569,963 | * 10/1996 | Rostoker | 257/773 |
| 5,770,476 | * 6/1998 | stone | 438/106 |
| 5,796,591 | * 8/1998 | Dalal | 361/779 |
| 5,848,467 | * 12/1998 | Khandros | 29/841 |
| 5,859,407 | * 1/1999 | Saiki | 219/209 |
| 5,966,587 | * 10/1999 | Karavakis | 438/15 |
| 5,972,734 | * 10/1999 | Carichner | 438/106 |
| 6,015,505 | * 1/2000 | David | 252/79.2 |
| 6,050,832 | * 4/2000 | Lee | 439/91 |
| 6,080,936 | * 6/2000 | Yamasaki | 174/263 |

* cited by examiner

Primary Examiner—Mary Wilczewski
Assistant Examiner—David Goodwin
(74) Attorney, Agent, or Firm—DeLio & Peterson LLC; Peter W. Peterson; Ira D. Blecker

(57) ABSTRACT

An apparatus for and method of minimizing the thermo-mechanical fatigue of flip-chip packages. The interposer of the present invention, preferably comprising an organic polymer such as polyimide, contains apertures having conductive plugs inserted therein for joining a chip to a substrate in an electronic module utilizing flip-chip packaging. The interposer is selected to provide optimum spacing between the chip and substrate having a coefficient of thermal expansion adapted to the thermal cycling temperature extremes of the module components. The interposer may comprise an inner core with two adhesive outer layers which may comprise different materials to promote adhesion at their respective interfaces within a module. Conductive plugs are disposed within the apertures of the interposer comprising of a first and second solder or comprising a conductive plug having top and bottom surfaces coated with a conductive adhesive. Preferably, the first solder is disposed within an interior of the apertures and the second solder is disposed within an exterior of the apertures such that the first solder is between a first portion and a second portion of the second solder. Upon reflow, the second solder is reflowed while the first solder remains solid.

50 Claims, 2 Drawing Sheets

UNDERFILL PREFORM INTERPOSER FOR JOINING CHIP TO SUBSTRATE

CROSS-REFERENCE TO RELATED APPLICATIONS

Aspects of the present invention are related to subject matter disclosed in co-pending applications entitled "Process for Forming Cone Shaped Solder for Chip Interconnection," Attorney Docket No. FI9-97-060, and "Dielectric Interposer for Chip to Substrate Soldering," Attorney Docket No. FI9-98-129 filed on even date herewith and assigned to the assignee of the present invention.

BACKGROUND OF THE INVENTION

1. Field of the Invention

This invention relates to the assembly of electronic modules, and in particular, to a structure and method of minimizing the thermo-mechanical fatigue that typically occurs as a result of the mismatch in the coefficients of thermal expansion of a chip and a substrate when they are joined in a flip-chip arrangement. It has wide applicability, including extension to very small joints and very densely populated arrays.

2. Description of Related Art

Multi-layer ceramic electronic components are typically joined together by soldering pads on a surface of one of the electronic components to corresponding pads on the surface of the other component. Controlled Collapse Chip Connection is an interconnect technology developed by IBM as an alternative to wire bonding. This technology is generally known as C4 technology or flip chip packaging. Broadly stated, one or more integrated circuit chips are mounted above a single or multi-layer ceramic substrate and pads on the chip are electrically and mechanically connected to corresponding pads on the substrate by a plurality of electrical connections such as solder bumps. The integrated circuit chips may be assembled in an array such as a 10×10 array on the multi-layer ceramic surface.

In FIG. 1, a typical electronic module 100 comprises a semiconductor chip 11, a substrate 13 and solder joints 15. The solder joints 15 may be lead/tin, or some other alloy, and may be fabricated by several technologies including evaporation or electroplating. The solder joints 15 can be formed by depositing solder bumps on the chip 11 forming metal receiving pads (not shown) on the substrate 13 which correspond to the solder joints 15 on the chip 11. Connection occurs when the chip 11 is aligned to the substrate 13, and the assembly is exposed to temperatures higher than the melting point of the solder. This so-called reflow and chip-join results in the fully assembled module 100, in which the circuits of the chip 11 are interconnected to the substrate 13. The substrate is then capable of providing power, along with input and output signals, to and from the chip.

During normal operation, the entire module is subject to temperature excursions due to the functioning of the circuits on the chip, resistance heating of the solder joints, the wiring within the chip, and the wiring within the substrate. This heating results in the expansion and contraction of all of these components as temperatures rise and fall. Chips are primarily comprised of silicon, which has a coefficient of thermal expansion in the range of about 3.0 ppm/° C. The corresponding substrates to which the chips are joined are typically made of ceramic or organic materials, which have coefficients of thermal expansion in the ranges of about 5 to 7 ppm/° C. and about 12 to 20 ppm/° C., respectively. As a result, the chip and the substrate expand and contract at different rates during thermal cycling. This mismatch places stresses on the solder joints, and over time results in the fatigue of the solder joints. Eventually, continual stressing causes cracks to propagate completely across the solder joints leading to electrical failure of the electronic module.

Useful product designs dictate that the fatigue life (time until failure) of solder joints in a flip-chip module be significantly greater than the reasonable expected life of the component. There is much prior art which addresses how to increase the longevity of flip-chip modules. For example, both empirical and modeling data exist which optimize the pad sizes on both the chip and the substrate, along with the solder volume, in order to minimize stresses induced by thermal extremes. In addition, the spatial configuration or layout of the interconnects can be manipulated to provide minimum thermal fatigue exposure. However, in many cases, this type of optimization is not sufficient to achieve a useful product life.

A prior art method of redistributing the stresses on the solder joints has been to underfill the space between the chip and the substrate with an underfill material as shown in FIG. 2. FIG. 2 depicts electronic module 200 having a chip 11 joined to a substrate 13 connected together by solder joints 15. A liquid underfill 17, such as a filled epoxy resin, is disposed between the chip 11 and the substrate 13 to fill the space between the chip and substrate. The underfill 17 is typically chosen to have a coefficient of thermal expansion approximately equal to the solder upon curing. The underfill 17 serves to distribute the stresses that would otherwise be concentrated on localized regions of the solder joints 15. The solder joints 15 become more immobilized such that they can tolerate repeated thermal cycling, to the extent that product requirements can be satisfied.

Although a proven means by which to enhance flip-chip reliability, underfill processes are often extremely difficult and expensive to execute. They are quite sensitive to the material flow properties of the liquid resin, and their success is highly dependent upon module geometry. Modules built with larger chips and very densely populated arrays are more difficult to underfill than those built with smaller chips. Problems with adhesion and voiding are common, and difficult to control. In addition, this type of processing is not easily extended to smaller dimensions: e.g., chip-to-substrate spacings of less than 2.5 mils, or to very large chips; e.g., greater than 20 mm on a side. Additionally, once the underfill is cured it is not easily removed, creating significant problems for chip removal and replacement.

Bearing in mind the problems and deficiencies of the prior art, it is therefore an object of the present invention to provide an apparatus which facilitates joining of a semiconductor chip to a substrate resulting in an electronic module less prone to mechanical and electrical failure.

It is another object of the present invention to provide an apparatus which facilitates the joining of a semiconductor chip to a substrate without the use of solder joints.

It is yet another object of the present invention to provide an apparatus which facilitates joining of a semiconductor chip having improved tolerances to the thermo-mechanical expansion and contraction of the chip and substrate during thermal cycling.

A further object of the invention is to provide a method of assembling electronic modules without the need for solder joints.

It is still yet another object of the present invention to provide a method of assembling electronic modules which maintain their integrity during thermal cycling.

Still other objects and advantages of the invention will in part be obvious and will in part be apparent from the specification.

SUMMARY OF THE INVENTION

The thermo-mechanical stress imparted to the solder joints is a function of the thermal cycling temperature extremes, differences in the coefficients of thermal expansion of the two interconnected materials, and the spacing between the two interconnected materials. This invention provides an easy and low cost method to vary the spacing. The thickness of the interposer can be chosen so as to provide the optimum spacing, balancing stress reduction and interposer manufacturability and interconnection. Conventional (prior art) solder bump interconnections with underfill cannot provide this spacing flexibility determination.

The above and other objects and advantages, which will be apparent to one of skill in the art, are achieved in the present invention which is directed to, in a first aspect, a flip chip semiconductor interconnect structure comprising a laminate interposer having apertures; and solder elements disposed within the apertures of the interposer, the solder elements comprising a first solder and a second solder having a higher melting point than the first solder.

Preferably, the laminate interposer comprises a material having a coefficient of thermal expansion corresponding to the coefficients of thermal expansion of a chip and a substrate when the interposer is used to connect a chip to a substrate. Most preferably, the laminate interposer comprises polyimide.

The structure in this first aspect of the present invention has the first solder disposed within an interior of the apertures and the second solder is disposed within an exterior of the apertures such that the first solder is between a first portion and a second portion of the second solder. Preferably, the second solder is reflowable while the first solder remains solid.

Preferably, the interposer is positioned between a chip and a substrate having conductive receiving pads.

The present invention is directed to, in another aspect, a flip chip interposer comprising an inner core having a plurality of apertures; a first outer layer on a surface of the inner core having corresponding apertures; and a second outer layer on a second surface of the inner core opposite the first outer layer having corresponding apertures; conductive plugs are disposed within the apertures of the outer layers, the plugs have top and bottom surfaces coated with a conductive adhesive. Preferably, the conductive plugs are metal.

Preferably, the inner core has a coefficient of thermal expansion between that of a chip and a substrate when the interposer is used in mounting and underfilling a chip to a substrate in an electronic package. Most preferably, the inner core comprises an organic polymer, even more preferably, comprising polyimide.

Preferably, the first and second outer layers are not of the same composition. Most preferably, the first and second outer layers are individually optimized to promote adhesion at their respective interfaces to a chip and a substrate in an electronic package.

In yet another aspect, the present invention is directed to an interposer for mounting and underfilling a semiconductor chip to a substrate comprising a laminate sheet having a central core layer, a first outer layer attached to the central core layer and a second outer layer attached to the central core layer opposite the first outer layer, the layers halting corresponding apertures; conductive plugs disposed within the apertures comprising a first solder and a second solder having a lower melting point than the first solder.

Preferably, the outer layers are adhesive and the central core layer has a coefficient of thermal expansion adapted to the coefficients of thermal expansion of a chip and a substrate when the interposer is used to connect a chip and a substrate.

Preferably, the first solder is disposed within an interior of the apertures and the second solder is disposed within an exterior of the apertures such that the first solder is between a first portion and a second portion of the second solder. Most preferably, the second solder is reflowable while the first solder remains solid.

In yet another aspect, the present invention is directed to an interposer for mounting and interconnecting a semiconductor chip to a substrate comprising a single laminate sheet having apertures, and solder plugs disposed within the apertures, the plugs having top and bottom surfaces coated with a conductive adhesive. Most preferably, the laminate sheet comprises a material having a coefficient of thermal expansion compatible to a chip and a substrate when using the interposer for mounting and underfilling the chip and substrate.

In still yet another aspect, the present invention is directed to a method of assembling an electronic module comprising the steps of: (a) providing a semiconductor chip; (b) providing a substrate for mounting the chip; (c) providing an interposer for connecting the chip to the substrate comprising a laminate sheet having apertures, and solder plugs disposed within the apertures of the laminate sheet, the solder plugs comprising a first solder and a second solder having a lower melting temperature than the first solder; (d) aligning the interposer between the chip and the substrate; and (e) heating the chip, substrate, and interposer to form an electronic module.

Preferably, the semiconductor chip and substrate have corresponding bonding pads and wherein in step (d) the interposer is aligned between the chip and the substrate such that the solder plugs correspond to the bonding pads of the chip and the substrate.

Preferably, in step (c) the first solder is disposed within an interior of the apertures and the second solder is disposed within an exterior of the apertures such that the first solder is between a first portion and second portion of the second solder. Also, in step (c) the laminate sheet has a coefficient of thermal expansion between a coefficient of thermal expansion of the chip and a coefficient of thermal expansion of the substrate.

Preferably, in step (e) the second solder is reflowed during heating of the chip, substrate and interposer, electrically connecting the chip to the substrate while the first solder remains solid.

In yet another aspect, the present invention is directed to a method of assembling an electronic module comprising the steps of: (a) providing a semiconductor chip; (b) providing a substrate for mounting the chip; (c) providing an interposer for connecting the chip to the substrate comprising a laminate sheet having a central core layer, a first outer layer attached to the central core layer and a second outer layer attached to the central core layer opposite the first outer layer, the layers having corresponding apertures; and conductive plugs disposed within the apertures, the plugs having a top and bottom surface coated with a conductive adhesive; (d) aligning the interposer between the chip and the substrate; and (e) heating the chip, substrate and interposer to form an electronic module.

The semiconductor chip and the substrate may have corresponding bonding pads, and in step (d) the interposer may be aligned between the chip and the substrate such that the solder plugs correspond to the bonding pads of the chip and the substrate.

Preferably, in step (c) the central core of the laminate sheet has a coefficient of thermal expansion between a coefficient of thermal expansion of the chip and a coefficient of thermal expansion of the substrate. Most preferably, the outer layers are adhesive.

In still yet another aspect, the present invention is directed to a method of assembling an electronic module comprising the steps of: (a) providing a semiconductor chip; (b) providing a substrate for mounting the chip; (c) providing an interposer for connecting the chip to the substrate comprising a laminate sheet having a central core layer, a first outer layer, a second outer layer opposite the first outer layer, and apertures throughout the layers; and solder plugs disposed within the apertures of the laminate sheet, the solder plugs comprising a first solder and a second solder having a lower melting temperature than the first solder; (d) aligning the interposer between the chip and the substrate; and (e) heating the chip, substrate and interposer to form an electronic module.

Preferably, in step (c) the central core of the laminate sheet has a coefficient of thermal expansion between a coefficient of thermal expansion of the chip and a coefficient of thermal expansion of the substrate, and most preferably, the outer layers are adhesive. Preferably, also in step (c), the first solder is disposed within an interior of the apertures and the second solder is disposed within an exterior of the apertures such that the first solder is between a first portion and second portion of the second solder.

The semiconductor chip and the substrate may have corresponding bonding pads, and in step (d) the interposer may be aligned between the chip and the substrate such that the solder plugs correspond to the bonding pads of the chip and the substrate.

Preferably, in step (e) the second solder is reflowed during heating of the chip, substrate and interposer, electrically connecting the chip to the substrate while the first solder remains solid.

In still yet another aspect, the present invention is directed to a method of assembling an electronic module comprising the steps of: (a) providing a semiconductor chip; (b) a substrate for mounting the chip; (c) providing an interposer for connecting the chip to the substrate, the interposer comprising a laminate sheet having apertures; and conductive plugs disposed within the apertures, the plugs having a top and bottom surface coated with a conductive adhesive; (d) aligning the interposer between the chip and the substrate; and (e) heating the chip, substrate and interposer to form an electronic module.

Preferably, the semiconductor chip and the substrate have corresponding bonding pads and wherein in step (d) the interposer is aligned between the chip and the substrate such that the solder plugs correspond to the bonding pads of the chip and the substrate.

Preferably, in step (c) the laminate sheet has a coefficient of thermal expansion between a coefficient of thermal expansion of the chip and a coefficient of thermal expansion of the substrate.

In still yet another aspect, the present invention is directed to a method of fabricating an interposer for use in electronic packaging comprising the steps of: (a) providing a laminate sheet; (b) forming a plurality of apertures in the sheet; and (c) depositing a first and second solder within the apertures, the second solder having a lower melting point than the first solder.

The method of the present aspect of the invention may further include, prior to step (a), the step of selecting the laminate sheet having a coefficient of thermal expansion between that of a chip and a substrate in a resulting electronic module.

Preferably, in step (a) the laminate sheet comprises an organic polymer, most preferably comprising polyimide. Preferably, in step (a), the laminate sheet comprises an inner core, a first outer layer disposed on the inner core, and a second outer layer disposed on the inner core opposite the first outer layer. Most preferably, the inner core has a coefficient of thermal expansion between a coefficient of thermal expansion of a chip and a coefficient of thermal expansion of a substrate in a resulting electronic module.

Step (b) comprises forming a plurality of apertures in the laminate sheet, preferably, using laser ablation, precision drilling, or photolithography.

In step (c), the first and second solders are deposited by electroplating comprising the steps of: (a) sputtering a thin conductive film on a surface of the laminate sheet; (b) plating a layer of the second solder; (c) plating a layer of the first solder over the second solder; and (d) plating a final layer of the second solder. The method of electroplating the first and second solders may further include the step of removing the sputtered conductive film.

Preferably, the first solder comprises a 95% lead and 5% tin alloy, or, in the alternative, copper. Preferably, the second solder comprises a eutectic lead/tin alloy.

In still yet another aspect, the present invention is directed to a method of fabricating an interposer for use in electronic packaging comprising the steps of: (a) providing a laminate sheet; (b) forming a plurality of apertures in the sheet; and (c) depositing a conductive metal plug within the apertures, the plugs having a top and bottom surface coated with a conductive adhesive. This method may further include, prior to step (a), the step of selecting the laminate sheet having a coefficient of thermal expansion between that of a chip and a substrate in a resulting electronic module.

Preferably, in step (a) the laminate sheet comprises an organic polymer, most preferably, polyimide. Also in step (a) the laminate comprises an inner core, a first outer layer disposed on the inner core, and a second outer layer disposed on the inner core opposite the first outer layer. Most preferably, the inner core has a coefficient of thermal expansion between a coefficient of thermal expansion of a chip and a coefficient of thermal expansion of a substrate in a resulting electronic module.

Step (b) comprises forming a plurality of apertures in the laminate sheet, preferably, using laser ablation, precision drilling, or photolithography.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
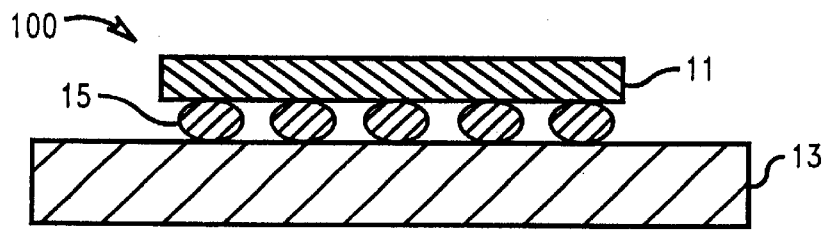
FIG. 1 is an elevational cross-sectional view of a flip-chip module of the prior art.
Figure 2:
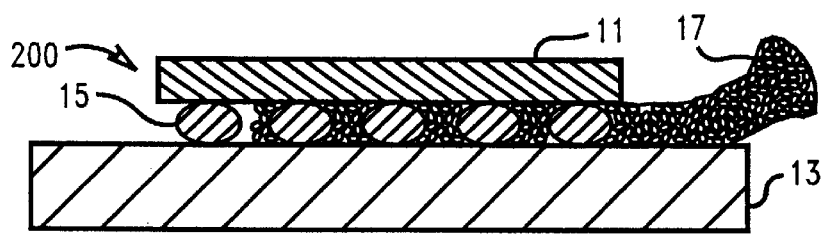
FIG. 2 is an elevational cross-sectional view of a liquid underfill dispense process for flip-chip modules known in the prior art.

In describing the preferred embodiment of the present invention, reference will be made herein to FIGS. 1–6 of the drawings in which like numerals refer to like features of the invention. Features of the invention are not necessarily shown to scale in the drawings.

Figure 3A:
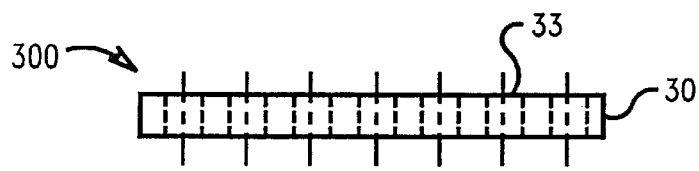
FIGS. 3a–3c are elevational cross-sectional views of the present invention showing the laminate sheet; the laminate sheet having filled apertures; and a method of using the interposer in an electronic module.
Figure 3B:
Figure 3C:
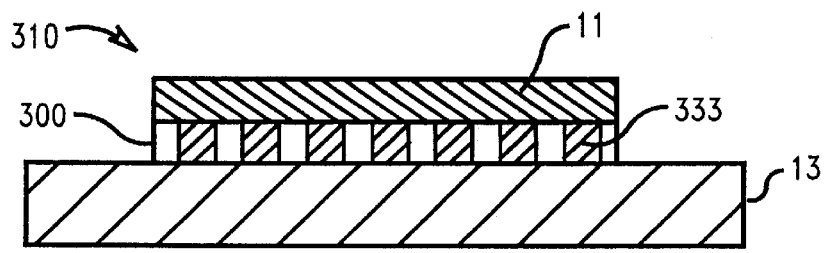

The present invention involves the use of a thin film interposer to make connections between a chip and a substrate for flip chip applications as depicted in FIGS. 3a–3c. The interposer 300 consists of a preformed laminate sheet 30, which is fabricated with multiple apertures or through-holes 33 as depicted in FIG. 3a. The laminate sheet 30 may comprise of an organic polymer such as polyimide, Kapton®, Mylar®, or any other material that will be stable at temperatures which are required to either join the interposer to the chip and the substrate, or to power the chip/substrate combination during normal operation.

The apertures 33 traverse the entire thickness of the laminate sheet 30. The apertures 33 may be formed in any number of ways known in the art, including, but not limited to, laser ablation, precision drilling, or photo processing. The apertures 33 are filled with a conductive material such as a metal, an alloy or a conductive polymer to form electrically conductive plugs 333 (see FIG. 3b). The conductive plugs 333 are spatially arranged to correspond to metal receiving pads (not shown) on both the chip and the substrate in the resulting electronic module 310. The plugs 333 may be formed using vapor deposition, plating, screening, or any other method appropriate to the size of the apertures and material being deposited.

Figure 4:
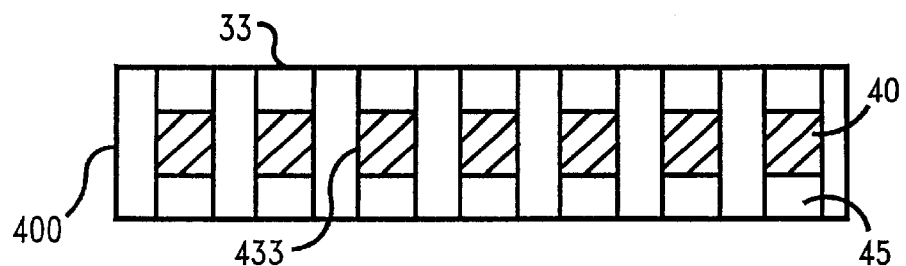
FIG. 4 is an elevated cross sectional view of an interposer of the present invention wherein the electrically conductive plugs consist of multiple solder layers.

Preferably, the apertures 33 may be filled with more than one type of metal or solder. As shown in FIG. 4, interposer 400 has conductive plugs 433 comprising a higher melting solder 40 deposited in the interior of the aperture 33, and a lower melting solder 45 deposited in the exteriors of apertures 33, such that the entire plug 433 does not become molten during the joining process. The plug 433 can be preferably formed by first sputtering a thin conductive film, such as copper, on one side of the laminate. The apertures 33 can then be plated up with a thin layer of a low melt solder, such as a eutectic lead/tin alloy, followed by plating a higher melting core such as copper or a 95% lead/5% tin alloy, and a final layer of low melt solder. Following electrodeposition of the plug metallurgy, the excess sputtered conductive film can be removed by selective wet etching.

Figure 5:
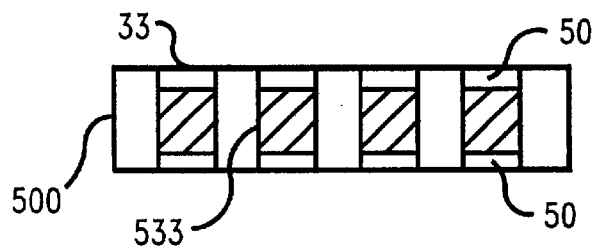
FIG. 5 is an elevated cross sectional view of an interposer of the present invention wherein the conductive plugs are coated with a conductive adhesive.

Also, as shown in FIG. 5, the interposer 500 has apertures 33 filled with either metal or solder plugs 533 in the interior of the apertures 33, and a conductive adhesive 50 on the top and bottom surfaces of the plugs 533. In this embodiment, the metal or solder plugs 533 need not become molten at all during the joining process.

Referring back to FIG. 3c, the interposer 300 is aligned between the chip 11 and the substrate 13, and the three elements are pressed together to form electronic module 310. The electronic module 310 is then heated to an elevated temperature which is sufficient to join the conductive plugs 333 to the receiving pads (not shown) on both the chip 11 and the substrate 13. In addition, the temperature is sufficient to fuse the laminate sheet 30 to the surfaces of both the chip 11 and the substrate 13. The result is a fully assembled electronic module 310, in which the interposer 300 serves to enhance reliability by filling the gap between the chip 11 and the substrate 13. The stresses generated during thermal expansion and contraction are redistributed enhancing the life of the electronic module.

Figure 6:
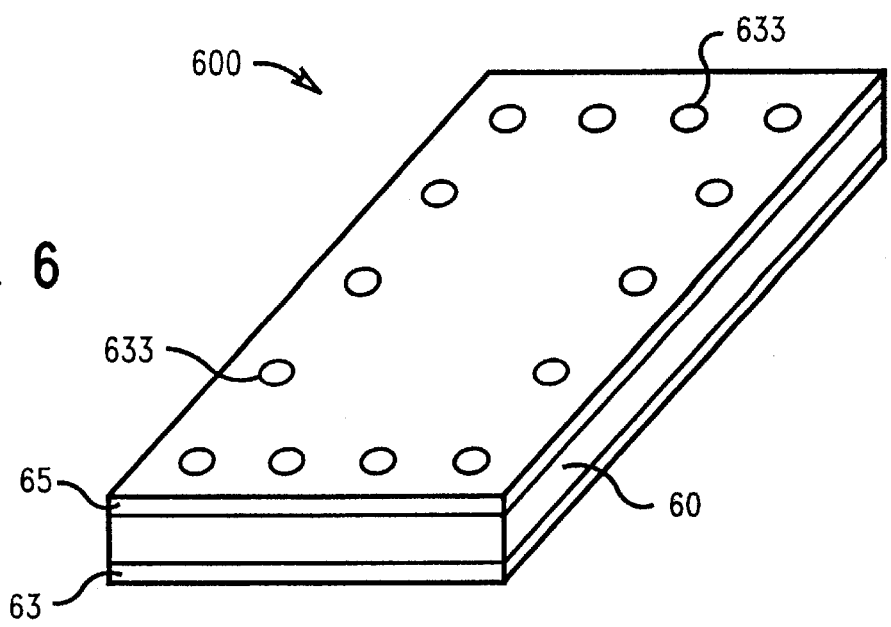
FIG. 6 is a perspective view of a preferred embodiment of the present invention wherein the laminate sheet comprises multiple layers.

FIG. 6 shows a another preferred embodiment wherein the interposer 600 consists of three layers: an inner core 60, and two thin outer layers 63, 65. Inner core 60 has a coefficient of thermal expansion between that of a chip and a substrate used in an electronic module. The outer layers 63, 65 are preferably adhesive to provide optimum bonding between a chip and the interposer 600, and the interposer 600 and a substrate. The adhesive outer layers 63, 65 need not be of the same composition, and may be individually optimized to promote good adhesion at their respective interfaces. The thickness of the inner core 60 is well controlled, such that the module chip-to-substrate spacing can be regulated. The adhesive constituting layers 63 and 65 can be selected so as to facilitate chip removal and replacement. More specifically, the adhesive can be a thermoplastic such that it can be re-melted upon thermal treatment. Alternatively, for situations in which a permanent adhesive coupling is needed a thermoset material can be used.

Also in this embodiment, the apertures 633 are created by laser ablation, which is capable of providing very small holes, at precision locations, with minimal handling of the interposer. The apertures are filled with both low melt and high melt solders, as is shown in FIG. 4. Similarly, the metal can be deposited by first sputtering a thin conductive film, such as copper, on one side of the laminate. The apertures 33 can then be plated up with a thin layer of a low melt solder, such as a eutectic lead/tin alloy, followed by plating a higher melting core such as copper or a 95% lead/5% tin alloy, and a final layer of low melt solder. Following electrodeposition of the plug metallurgy, the sputtered conductive film can be removed by selective wet etching.

This embodiment provides extreme flexibility in its ability to provide well adhered modules with small interconnects at high densities, and is applicable to a wide range of packages including ceramic and organic.

In another embodiment, the layers 60, 63, and 65, of the interposer 600 may have a variety of coefficient of thermal expansions as deemed appropriate to modulate from the coefficient of thermal expansion of the chip to the coefficient of thermal expansion of the substrate.

The present invention achieves the objects recited above. The interposer of the present invention has significantly fewer limitations than conventional underfill processes. It is highly extendible to very small interconnects, very small chip-to-substrate spacings, and very large chips. By tightly controlling the thickness of the laminate film, this invention offers an opportunity for very well defined spacing between the chip and the substrate. Very often, a high level of co-planarity between the chip and the substrate is desirable when the module is used in conjunction with heat removal appliances.

Th present invention also eliminates the need to form solder bumps directly on either silicon wafers or substrates. Traditional bumping processes are typically prone to defects such as misshapen, or improperly sized bumps. Such bumping defects, even when detected by inspection prior to assembly of the electronic module, usually result in the loss of the affected chip. In contrast, interposers of the present invention can be inspected prior to assembly, and discarded before use when defects are noted.

The present invention presents a structure and method of using a pre-formed laminate interposer to form a flip-chip interconnect structure. This invention has application in all situations wherein electrical and mechanical interconnection utilize solder bumps between the components with dissimilar coefficient of thermal expansions. Alternative applications include ceramic substrate to organic laminate printed wiring board, chip to organic laminate printed wiring board (typically referred to as chip-on-board), chip to flexcircuit (typically referred to as chip-on-flex), organic printed wiring board to organic printed wiring board wherein the two printed wiring boards are constructed of dissimilar materials. The laminate is fabricated as a freestanding film having apertures which are subsequently filled with conductive material. The film is positioned between a chip and a substrate which contain conductive receiving pads. The entire assembly is heat treated to form a completely underfilled, fully interconnected module with enhanced performance and integrity. The unexpected advantages of a module formed using the method of the present invention include greater stability during thermal cycling since the stresses created during thermal cycling are evenly distributed.

It is important to note that this invention is not restricted to chip on ceramic substrate applications. Substrates comprised of organic laminate materials also find direct application. In fact, it is these applications that require utilization of this technology driven primarily by the greater coefficient of thermal expansion of organic laminate substrates when compared with ceramic substrates. Additionally, the maximum joining temperature of the organic laminate substrates is restricted compared with ceramic substrates. Therefore, the variations in joining interconnection materials enabling reduced temperature embodied in this invention are directly applicable to organic laminate substrates.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of assembling an electronic module comprising the steps of:
   (a) providing a semiconductor chip;
   (b) providing a substrate for mounting said chip;
   (c) providing an interposer for connecting said chip to said substrate comprising:
      a laminate sheet having apertures; and
      solder plugs disposed within said apertures of said laminate sheet, said solder plugs comprising a first solder and a second solder having a lower melting temperature than said first solder;
   (d) aligning said interposer between said chip and said substrate; and
   (e) heating said semiconductor chip, substrate, and interposer to a temperature sufficient to fuse said laminate sheet to surfaces of said semiconductor chip and said substrate thereby filling a gap between said semiconductor chip and said substrate while joining said solder plugs to corresponding bonding pads on said semiconductor chip and said substrate to form an electronic module.

2. The method of claim 1 wherein in step (d) said interposer is aligned between said semiconductor chip and said substrate such that said solder plugs are aligned to said corresponding bonding pads of said semiconductor chip and said substrate.

3. The method of claim 1 wherein in step (c) said first solder is disposed within an interior of said apertures and said second solder is disposed within an exterior of said apertures such that said first solder is between a first portion and second portion of said second solder.

4. The method of claim 1 wherein in step (e) said solder plugs are joined to said corresponding bonding pads on said semiconductor chip and said substrate by reflowing said second solder during heating of said chip, substrate and interposer, electrically connecting said chip to said substrate while said first solder remains solid.

5. The method of claim 1 wherein in step (c) said laminate sheet has a coefficient of thermal expansion between a coefficient of thermal expansion of said chip and a coefficient of thermal expansion of said substrate.

6. A method of assembling an electronic module comprising the steps of:
   (a) providing a semiconductor chip;
   (b) providing a substrate for mounting said chip;
   (c) providing an interposer for connecting said chip to said substrate comprising:
      a laminate sheet having a central core layer, a first outer layer attached to said central core layer and a second outer layer attached to said central core layer opposite said first outer layer, said layers having corresponding apertures; and
      conductive plugs disposed within said apertures, wherein only a top and bottom surface of said plugs are coated with a conductive adhesive;
   (d) aligning said interposer between said chip and said substrate; and
   (e) heating said semiconductor chip, substrate, and interposer to a temperature sufficient to fuse said laminate sheet to surfaces of said semiconductor chip and said substrate thereby filling a gap between said semiconductor chip and said substrate while joining said solder plugs to corresponding bonding pads on said semiconductor chip and said substrate to form an electronic module.

7. The method of claim 6 wherein said semiconductor chip and said substrate have corresponding bonding pads and wherein in step (d) said interposer is aligned between said chip and said substrate such that said solder plugs correspond to the bonding pads of said chip and said substrate.

8. The method of claim 6 wherein in step (c) said central core of said laminate sheet has a coefficient of thermal expansion between a coefficient of thermal expansion of said chip and a coefficient of thermal expansion of said substrate.

9. The method of claim 6 wherein in step (c) said outer layers are adhesive.

10. A method of assembling an electronic module comprising the steps of:
(a) providing a semiconductor chip;
(b) providing a substrate for mounting said chip;
(c) providing an interposer for connecting said chip to said substrate comprising:
a laminate sheet having a central core layer, a first outer layer, a second outer layer opposite said first outer layer, and apertures throughout said layers; and
solder plugs disposed within said apertures of said laminate sheet, said solder plugs comprising a first solder and a second solder having a lower melting temperature than said first solder;
(d) aligning said interposer between said chip and said substrate; and
(e) heating said semiconductor chip, substrate, and interposer to a temperature sufficient to fuse said laminate sheet to surfaces of said semiconductor chip and said substrate thereby filling a gap between said semiconductor chip and said substrate while joining said solder plugs to corresponding bonding pads on said semiconductor chip and said substrate to form an electronic module.

11. The method of claim 10 wherein in step (c) said central core of said laminate sheet has a coefficient of thermal expansion between a coefficient of thermal expansion of said chip and a coefficient of thermal expansion of said substrate.

12. The method of claim 10 wherein in step (c) said first solder is disposed within an interior of said apertures and said second solder is disposed within an exterior of said apertures such that said first solder is between a first portion and second portion of said second solder.

13. The method of claim 10 wherein in step (c) said outer layers are adhesive.

14. The method of claim 10 wherein said semiconductor chip and said substrate have corresponding bonding pads and wherein in step (d) said interposer is aligned between said chip and said substrate such that said solder plugs correspond to the bonding pads of said chip and said substrate.

15. The method of claim 10 wherein in step (e) said second solder is reflowed during heating of said chip, substrate and interposer, electrically connecting said chip to said substrate while said first solder remains solid.

16. A method of assembling an electronic module comprising:
(a) providing a semiconductor chip;
(b) providing a substrate for mounting said chip;
(c) providing an interposer for connecting said chip to said substrate, said interposer comprising:
a laminate sheet having apertures; and
conductive plugs disposed within said apertures, wherein only a top and bottom surface of said plugs are coated with a conductive adhesive;
(d) aligning said interposer between said chip and said substrate; and
(e) heating said semiconductor chip, substrate, and interposer to a temperature sufficient to fuse said laminate sheet to surfaces of said semiconductor chip and said substrate thereby filling a gap between said semiconductor chip and said substrate while joining said solder plugs to corresponding bonding pads on said semiconductor chip and said substrate to form an electronic module.

17. The method of claim 16 wherein said semiconductor chip and said substrate have corresponding bonding pads and wherein in step (d) said interposer is aligned between said chip and said substrate such that said solder plugs correspond to the bonding pads of said chip and said substrate.

18. The method of claim 16 wherein in step (c) said laminate sheet has a coefficient of thermal expansion between a coefficient of thermal expansion of said chip and a coefficient of thermal expansion of said substrate.

19. A method of fabricating an interposer for use in electronic packaging comprising the steps of:
(a) providing a laminate sheet;
(b) forming a plurality of apertures in said sheet; and
(c) depositing a first and second solder within said apertures, said second solder having a lower melting point than said first solder,
wherein said laminate sheet of said interposer and said first solder and second solder within said apertures in said laminate sheet are heated to a temperature sufficient to fuse said laminate sheet to surfaces of a semiconductor chip and a substrate thereby filling a gap between said semiconductor chip and said substrate while said second solder is reflowed during heating to electrically connecting said semiconductor chip to said substrate while said first solder remains solid.

20. The method of claim 19 further including, prior to step (a), the step of selecting said laminate sheet having a coefficient of thermal expansion between that of a chip and a substrate in a resulting electronic module.

21. The method of claim 19 wherein in step (a) said laminate sheet comprises an organic polymer.

22. The method of claim 19 wherein in step (a) said laminate sheet comprises polyimide.

23. The method of claim 19 wherein in step (a) said laminate sheet comprises an inner core, a first outer layer disposed on said inner core, and a second outer layer disposed on said inner core opposite said first outer layer.

24. The method of claim 23 wherein said inner core has a coefficient of thermal expansion between a coefficient of thermal expansion of a chip and a coefficient of thermal expansion of a substrate in a resulting electronic module.

25. The method of claim 19 wherein step (b) comprises forming a plurality of apertures in said laminate sheet using laser ablation.

26. The method of claim 19 wherein step (b) comprises forming a plurality of apertures in said laminate sheet by drilling.

27. The method of claim 19 wherein step (b) comprises forming a plurality of apertures in said laminate sheet using photolithography.

28. A method of fabricating an interposer for use in electronic packaging comprising the steps of:
(a) providing a laminate sheet;
(b) forming a plurality of apertures in said sheet; and
(c) depositing a conductive metal plug within said apertures, wherein only a top and bottom surface of said plugs are coated with a conductive adhesive.

29. The method of claim 28 further including, prior to step (a), the step of selecting said laminate sheet having a coefficient of thermal expansion between that of a chip and a substrate in a resulting electronic module.

30. The method of claim 28 wherein in step (a) said laminate sheet comprises an organic polymer.

31. The method of claim 28 wherein in step (a) said laminate sheet comprises polyimide.

32. The method of claim 28 wherein in step (a) said laminate comprises an inner core, a first outer layer disposed on said inner core, and a second outer layer disposed on said inner core opposite said first outer layer.

33. The method of claim 32 wherein said inner core has a coefficient of thermal expansion between a coefficient of thermal expansion of a chip and a coefficient of thermal expansion of a substrate in a resulting electronic module.

34. The method of claim 28 wherein step (b) comprises forming a plurality of apertures in said laminate sheet using laser ablation.

35. The method of claim 28 wherein step (b) comprises forming a plurality of apertures in said laminate sheet by drilling.

36. The method of claim 28 wherein step (b) comprises forming a plurality of apertures in said laminate sheet using photolithography.

37. A method of fabricating an interposer for use in electronic packaging comprising the steps of:
   (a) providing a laminate sheet;
   (b) forming a plurality of apertures in said sheet;
   (c) sputtering a thin conductive film on a surface of said laminate sheet;
   (d) electroplating a second solder within said apertures, said second solder having a lower melting point than a first solder;
   (e) electroplating a layer of said first solder over said second solder; and
   (f) electroplating a final layer of said second solder.

38. The method of claim 37 further including the step of removing said sputtered conductive film.

39. The method of claim 37 wherein said first solder comprises a 95% lead and 5% tin alloy.

40. The method of claim 37 wherein said first solder comprises copper.

41. The method of claim 37 wherein said second solder comprises a eutectic lead/tin alloy.

42. The method of claim 37 further including, prior to step (a), the step of selecting said laminate sheet having a coefficient of thermal expansion between that of a chip and a substrate in a resulting electronic module.

43. The method of claim 37 wherein in step (a) said laminate sheet comprises an organic polymer.

44. The method of claim 37 wherein in step (a) said laminate sheet comprises polyimide.

45. The method of claim 37 wherein in step (a) said laminate sheet comprises an inner core, a first outer layer disposed on said inner core, and a second outer layer disposed on said inner core opposite said first outer layer.

46. The method of claim 45 wherein said inner core has a coefficient of thermal expansion between a coefficient of thermal expansion of a chip and a coefficient of thermal expansion of a substrate in a resulting electronic module.

47. The method of claim 37 wherein step (b) comprises forming a plurality of apertures in said laminate sheet using laser ablation.

48. The method of claim 37 wherein step (b) comprises forming a plurality of apertures in said laminate sheet by drilling.

49. The method of claim 37 wherein step (b) comprises forming a plurality of apertures in said laminate sheet using photolithography.

50. The method of claim 28 wherein step (c) said conductive metal plug within said apertures are deposited by electroplating comprising the steps of:
   sputtering a thin conductive film on a surface of said laminate sheet;
   plating a second solder within said apertures, said second solder having a lower melting point than a first solder;
   plating a layer of said first solder over said second solder; and
   plating a final layer of said second solder.

* * * * *